United States Patent
Hollis et al.

(10) Patent No.: US 11,088,895 B2
(45) Date of Patent: Aug. 10, 2021

(54) METHODS AND APPARATUSES FOR SIGNAL TRANSLATION IN A BUFFERED MEMORY

(71) Applicant: MICRON TECHNOLOGY, INC., Boise, ID (US)

(72) Inventors: Timothy M. Hollis, Meridian, ID (US); Dean Gans, Nampa, ID (US); Randon Richards, Kuna, ID (US); Bruce W. Schober, Vienna, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/881,337

(22) Filed: May 22, 2020

(65) Prior Publication Data

US 2020/0287778 A1   Sep. 10, 2020

Related U.S. Application Data

(63) Continuation of application No. 16/216,742, filed on Dec. 11, 2018, now Pat. No. 10,700,918, which is a
(Continued)

(51) Int. Cl.
*G06F 13/00* (2006.01)
*H04L 12/24* (2006.01)
(Continued)

(52) U.S. Cl.
CPC .......... *H04L 41/0226* (2013.01); *G06F 13/00* (2013.01); *G11C 7/1006* (2013.01);
(Continued)

(58) Field of Classification Search
CPC ....... G11C 7/1006; G11C 7/1057; G11C 5/04; G11C 7/1087; H04L 41/0226; H04L 47/6225
(Continued)

(56) References Cited

U.S. PATENT DOCUMENTS 4,298,929 A   11/1981   Capozzi
5,166,956 A   11/1992   Baltus et al.
(Continued)

FOREIGN PATENT DOCUMENTS

CN   101556572 A     10/2009
WO   2018175248 A1   9/2018

OTHER PUBLICATIONS

International Search Report and Written Opinion dated Jul. 11, 2018 for PCT Application No. PCT/US2018/022919, 10 pages.
(Continued)

*Primary Examiner* — Emmanuel Bayard
(74) *Attorney, Agent, or Firm* — Dorsey & Whitney LLP

(57) ABSTRACT

According to one embodiment, a data buffer is described. The data buffer comprises a first input/output circuit configured to receive and provide a first signal encoded according to a first communications protocol, a second input/output circuit configured to receive and provide a second signal encoded according to a second communications protocol, and a conversion circuit coupled to the first and second input/output circuits and configured to convert the first signal to the second signal and to convert the second signal to the first signal.

20 Claims, 13 Drawing Sheets

Related U.S. Application Data continuation of application No. 15/465,421, filed on Mar. 21, 2017, now Pat. No. 10,164,817.

(51) Int. Cl.
| | | |
|---|---|---|
| H04L 12/863 | (2013.01) | |
| G11C 7/10 | (2006.01) | |
| H04L 25/03 | (2006.01) | |
| G11C 7/22 | (2006.01) | |
| G11C 5/04 | (2006.01) | |

(52) U.S. Cl.
CPC .......... *G11C 7/1057* (2013.01); *G11C 7/1066* (2013.01); *G11C 7/1084* (2013.01); *G11C 7/1087* (2013.01); *G11C 7/1093* (2013.01); *H04L 25/03885* (2013.01); *H04L 47/6225* (2013.01); *G11C 5/04* (2013.01); *G11C 7/222* (2013.01); *G11C 2207/101* (2013.01); *G11C 2207/107* (2013.01); *G11C 2207/108* (2013.01)

(58) Field of Classification Search
USPC ........................................................ 375/359
See application file for complete search history.

(56) References Cited

U.S. PATENT DOCUMENTS

| | | | |
|---|---|---|---|
| 5,262,984 | A | 11/1993 | Noguchi et al. |
| 5,887,148 | A * | 3/1999 | Lentz .................. G06F 13/4018 710/307 |
| 6,285,624 | B1 | 9/2001 | Chen |
| 6,697,921 | B1 * | 2/2004 | Aoki ...................... G06F 3/0613 710/305 |
| 7,013,359 | B1 | 3/2006 | Li |
| 7,617,356 | B2 | 11/2009 | Bains |
| 8,291,139 | B2 | 10/2012 | Hollis |
| 8,553,459 | B2 | 10/2013 | Shinozaki et al. |
| 8,760,328 | B1 | 6/2014 | Koay et al. |
| 9,577,854 | B1 | 2/2017 | Hollis |
| 10,164,817 | B2 | 12/2018 | Hollis et al. |
| 10,700,918 | B2 | 6/2020 | Hollis et al. |
| 2005/0135489 | A1 | 6/2005 | Ho et al. |
| 2006/0107154 | A1 | 5/2006 | Bansal et al. |
| 2006/0129733 | A1 | 6/2006 | Sobelman |
| 2006/0248422 | A1 | 11/2006 | Puvvada et al. |
| 2007/0126479 | A1 | 6/2007 | Hur et al. |
| 2009/0037621 | A1 | 2/2009 | Boomer et al. |
| 2009/0109767 | A1 * | 4/2009 | Takahashi ............ G11C 7/1057 365/189.18 |
| 2009/0225873 | A1 | 9/2009 | Lee et al. |
| 2009/0262590 | A1 | 10/2009 | Nakazawa |
| 2009/0323414 | A1 | 12/2009 | Fibranz et al. |
| 2010/0023800 | A1 * | 1/2010 | Harari .................. G06F 12/0246 714/2 |
| 2010/0049878 | A1 | 2/2010 | Yu et al. |
| 2010/0322308 | A1 | 12/2010 | Lee et al. |
| 2010/0332928 | A1 | 12/2010 | Li et al. |
| 2011/0041005 | A1 * | 2/2011 | Selinger .................. G06F 11/10 714/719 |
| 2011/0090734 | A1 | 4/2011 | Burger, Jr. et al. |
| 2011/0161784 | A1 * | 6/2011 | Selinger .............. G06F 11/1068 714/768 |
| 2012/0269206 | A1 | 10/2012 | Zid et al. |
| 2013/0141992 | A1 | 6/2013 | Lee et al. |
| 2013/0145088 | A1 | 6/2013 | Frost et al. |
| 2013/0173846 | A1 * | 7/2013 | Lassa .................... G06F 3/0688 711/103 |
| 2013/0290813 | A1 | 10/2013 | Ramamoorthy et al. |
| 2014/0029331 | A1 | 1/2014 | Gopalakrishnan et al. |
| 2014/0169092 | A1 * | 6/2014 | Miyamoto ............. G11C 16/24 365/185.09 |
| 2014/0177645 | A1 | 6/2014 | Cronie et al. |
| 2014/0254730 | A1 | 9/2014 | Kim et al. |
| 2014/0372831 | A1 * | 12/2014 | Oh ...................... G06F 11/1012 714/764 |
| 2015/0178204 | A1 * | 6/2015 | Ray ...................... G06F 1/3287 711/103 |
| 2015/0180994 | A1 | 6/2015 | Hollis |
| 2016/0004477 | A1 * | 1/2016 | Okada .................... G06F 13/28 710/4 |
| 2016/0019182 | A1 | 1/2016 | Clements et al. |
| 2017/0054580 | A1 | 2/2017 | Hollis |
| 2017/0132162 | A1 | 5/2017 | Hollis |
| 2017/0140807 | A1 | 5/2017 | Sun et al. |
| 2017/0155529 | A1 | 6/2017 | Aung et al. |
| 2017/0192711 | A1 | 7/2017 | Muralimanohar et al. |
| 2018/0081583 | A1 * | 3/2018 | Breternitz ................. G06F 9/30 |
| 2018/0278461 | A1 | 9/2018 | Hollis et al. |
| 2019/0109755 | A1 | 4/2019 | Hollis et al. |
| 2019/0259447 | A1 * | 8/2019 | Shaeffer ............... G06F 13/4027 |
| 2019/0384728 | A1 | 12/2019 | Hollis |

OTHER PUBLICATIONS

IPRP dated Oct.3, 2019 for PCT Application No. PCT/US2018/022919, pp. all.
U.S. Appl. No. 16/553,065 titled "Apparatuses and Methods for Asymmetric Bi-Directional Signaling Incorporating Multi-Level Encoding", filed Aug. 27, 2019, pp. all.
U.S. Appl. No. 16/216,742 titled "Methods and Apparatuses for Signal Translation in a Buffered Memory", filed Dec. 11, 2018; pp. all.
U.S. Appl. No. 14/831,517, entitled "Apparatuses and Methods for Asymmetric Bi-Directional Signaling Incorporating Multi-Level Encoding", filed Aug. 20, 2015, pp. all.
Parrish, Kevin "Samsung's 8Gb LPDDR4 Chip Brings 4GB DDR4 to Mobile", Samsung's 8Gb LPDDR4 Chip Brings 4GB DDR4 to Mobile, Samsung Press Release, Dec. 30, 2013, pp. all.
EESR dated Nov. 25, 2020 for EP Application No. 18770793.0, 9 pgs.

* cited by examiner

METHODS AND APPARATUSES FOR SIGNAL TRANSLATION IN A BUFFERED MEMORY

CROSS-REFERENCE TO RELATED APPLICATION(S)

This application is a continuation of U.S. patent application Ser. No. 16/216,742 filed on Dec. 11, 2018 and issued as U.S. Pat. No. 10,700,918 on Jun. 30, 2020, which is a continuation of U.S. patent application Ser. No. 15/465,421, filed Mar. 21, 2017 and issued as U.S. Pat. No. 10,164,817 on Dec. 25, 2018. The aforementioned applications, and issued patents, are incorporated by reference herein, in their entirety, and for any purposes.

BACKGROUND

Buffered memory systems, also known as registered memory, such as load reduced dual in-line memory modules (LRDIMM) include one or more buffers or registers between the memory controller or host system (e.g., a processor issuing memory commands) and the memory. Buffered memory systems may improve system stability as the number of memory modules in the system increases by reducing the electrical load on the host system compared to unbuffered memory systems. The buffers may be command buffers, address buffers, data buffers, or some combination thereof. Traditional buffered memory systems maintain a 1:1 ratio in data speed between the host and the memory. That is, the host and memory traditionally operate at the same clock frequency. This limits overall system performance because transistor response within the memory is typically slower than processor speeds. Thus, system performance is limited by transistor response within the memory device.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments disclosed herein overcome the limitations of traditional systems in which chips of unequal speed capabilities communicate. For clarity, examples described herein are presented in the context of computer memory systems. However, other applications are possible to improve the performance of systems in which chips of different speed capabilities communicate. For example, communication implementing fin field-effect transistors (FinFETs) in processors, and/or legacy transistors in a modem. One specific application may be improving the performance of buffered memory systems by converting binary signals on the host side of the data buffer to multilevel signals on the memory side of the data buffer and vice versa. By encoding data in multilevel signals on the memory side of the data buffer, the speed of the clock used to capture the data in the memory may be reduced (e.g., reduced frequency), thereby reducing the impact of transistor response as a limiting factor in memory speeds. Embodiments disclosed herein may confer several benefits. For example, signal margin may increase. Lower clock frequency operation may result in improved thermal properties of the device by reducing power consumption. The system may scale with additional memories added to the memory system.

Figure 1:
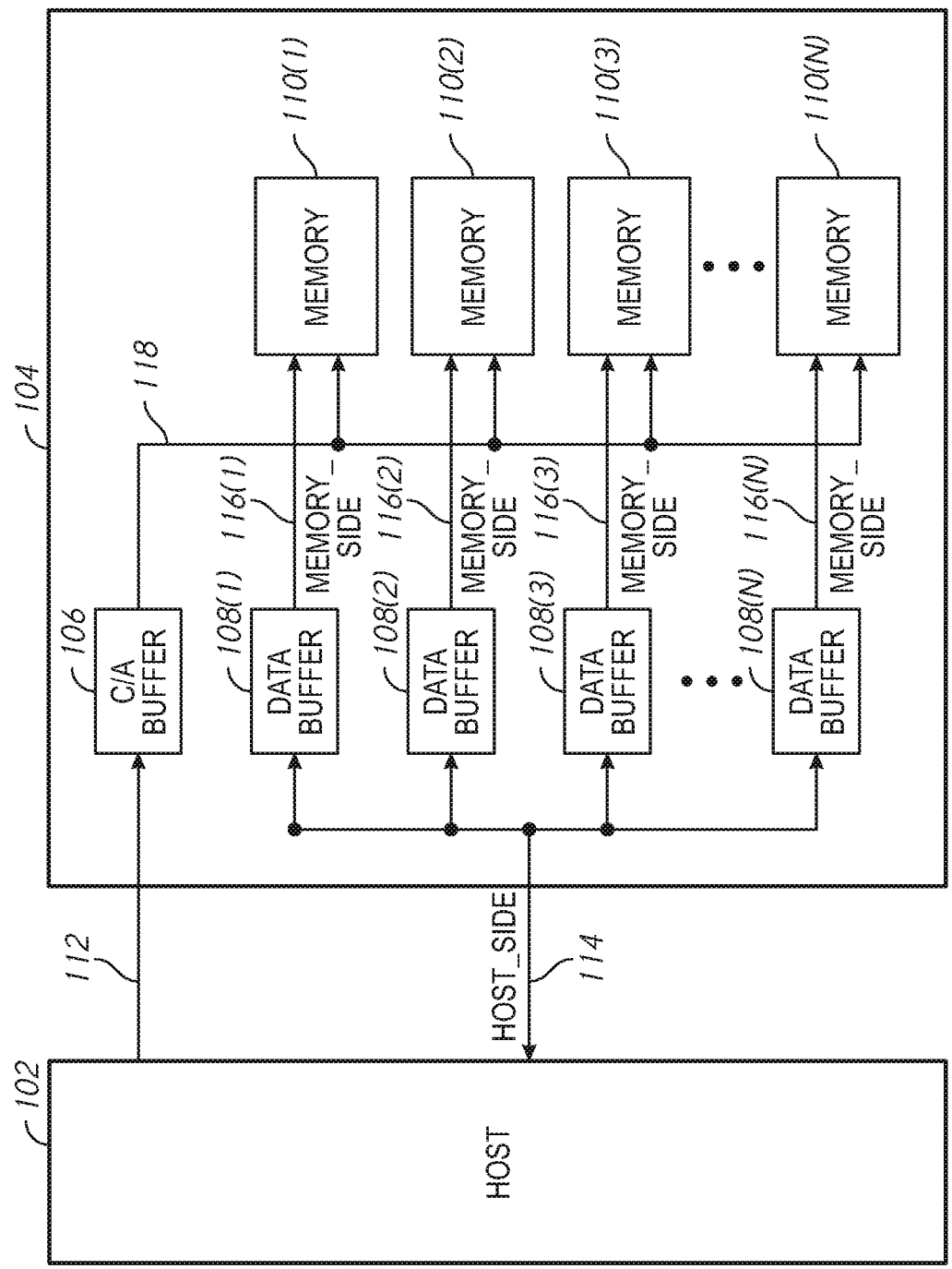
FIG. 1 is a block diagram of a memory system, in accordance with an embodiment of the present invention.

FIG. 1 is a block diagram of a memory system, generally designated 100, in accordance with an embodiment of the present invention. The memory system 100 includes a host 102 and a memory device 104. The host 102 provides instructions to the memory device 104 to perform memory operations, such as read and write operations. The host 102 may provide command information and/or address information to the memory device 104 over a command/address bus 112. The host 102 may provide and receive data associated with memory operations via a host-side data bus 14. The host 102 may be, for example, a memory controller or processor, such as a central processing unit or a graphics processing unit.

The memory 104 is a buffered memory device including a command/address buffer 106 coupled to the command/address bus 112, a plurality of data buffers 108(1)-(N) coupled to the host-side data bus 114, and a plurality of memories 110(1)-(N) coupled to a respective data buffer 108(1)-(N) over a respective memory-side data bus 116(1)-(N). The memory device 104 may receive the command and/or address information via the command/address bus 112 and receive and/or provide a data signal, such as the HOST_SIDE signal, via the host-side data bus 114. In response to the command/address information, and/or the received HOST_SIDE signal, the memory device 104 may perform memory operations and return information, such as read data or write confirmation information, to the host 102 via the host-side data bus 114. The command/address buffer 106 may receive command/address information from the host 102 via the command/address bus 112 and provide the command/address information to one or more of the plurality of memories 110(1)-(N) via an internal command/address bus 118.

The host-side data bus 114 may be configured to carry a data signal, such as the HOST_SIDE signal between the host 102 and the memory device 104. The HOST_SIDE signal may be encoded according to a first communications protocol. The communications protocol may specify a system of rules that allow two or more devices to communicate over the host-side data bus. The first communications protocol may be, for example a communication protocol associated with a particular type of memory device, such as Double Data Rate-4 (DDR4), Low Power DDR4 (LPDDR4), LPDDR4x, DDR3, Serializer/Deserializer (SERDES) (e.g., PCI Express, PCIe 3, etc.), etc. In some embodiments, the HOST_SIDE signal may be a binary signal having two possible logic states (e.g., logic 0 or 1).

Each data buffer 108 of the plurality of data buffers 108(1)-(N) is configured to receive the HOST_SIDE signal, which is encoded according to a first communication protocol, and convert the HOST_SIDE signal to a MEMORY_SIDE signal encoded according to a second communication protocol and vice versa. The second communications protocol may be associated with a particular type of memory, such as DDR4, LPDDR4, LPDDR4x, DDR3, SERDES, etc. In some embodiments, the MEMORY_SIDE signal may be a multilevel signal. For example, two bits may be encoded as a single voltage level corresponding to a logical state of those two bits (e.g., logic 00, 01, 10, or 11). Other types of multilevel signals may also be used. By translating between the HOST_SIDE signal and the MEMORY_SIDE signal, the data buffers 108(1)-(N) enable the host to communicate with the memory device 104 using a first communications protocol and each of the memories 110(1)-(N) to operate using data input that is encoded according to a second communications protocol. For example, in one embodiment, a data buffer 108 may receive a HOST_SIDE signal encoded for a DDR4 memory, and convert the received signal to a MEMORY_SIDE signal encoded for an LPDDR4 memory. As another example, a data buffer 108 may convert a HOST_SIDE signal encoded as a binary signal (e.g., a binary pulsed amplitude modulation (PAM2) signal) to a MEMORY_SIDE signal encoded as a multilevel signal (e.g., a PAM4 signal). In such an embodiment, clock signals may be relaxed on the memory side of the data buffer 108 while maintaining or increasing the total data bandwidth because more data is encoded in each data symbol (e.g., the voltage level sampled during a data eye).

Each data buffer 108 may be configured to communicate with a respective memory 110 over a respective memory-side bus 116. The memory-side buses 116(1)-(N) may be relatively short, clean channels compared to the host-side data bus. For example, the memory-side data buses 116(1)-(N) may each be less than 20 mm. Other lengths may also be used. By limiting the length and noise on the memory-side data buses 116(1)-(N), the number of bits encoded in each data symbol may be increased because finer divisions between voltage levels may be transmitted without noise compromising the signal integrity.

The memories 110(1)-(N) may generally be any type of memory capable of performing memory operations and receiving/providing the MEMORY_SIDE signal encoded according to the second communications protocol. For example, in embodiments where the MEMORY_SIDE signal is encoded according to a DDR4 protocol, then the memory 110 may be configured to receive, transmit, and perform memory operations with data encoded according to a DDR4 protocol. Similarly, in embodiments where the MEMORY_SIDE signal is encoded as a multilevel signal, the memory 110 may be configured to receive and decode the multilevel signal.

Figure 2:
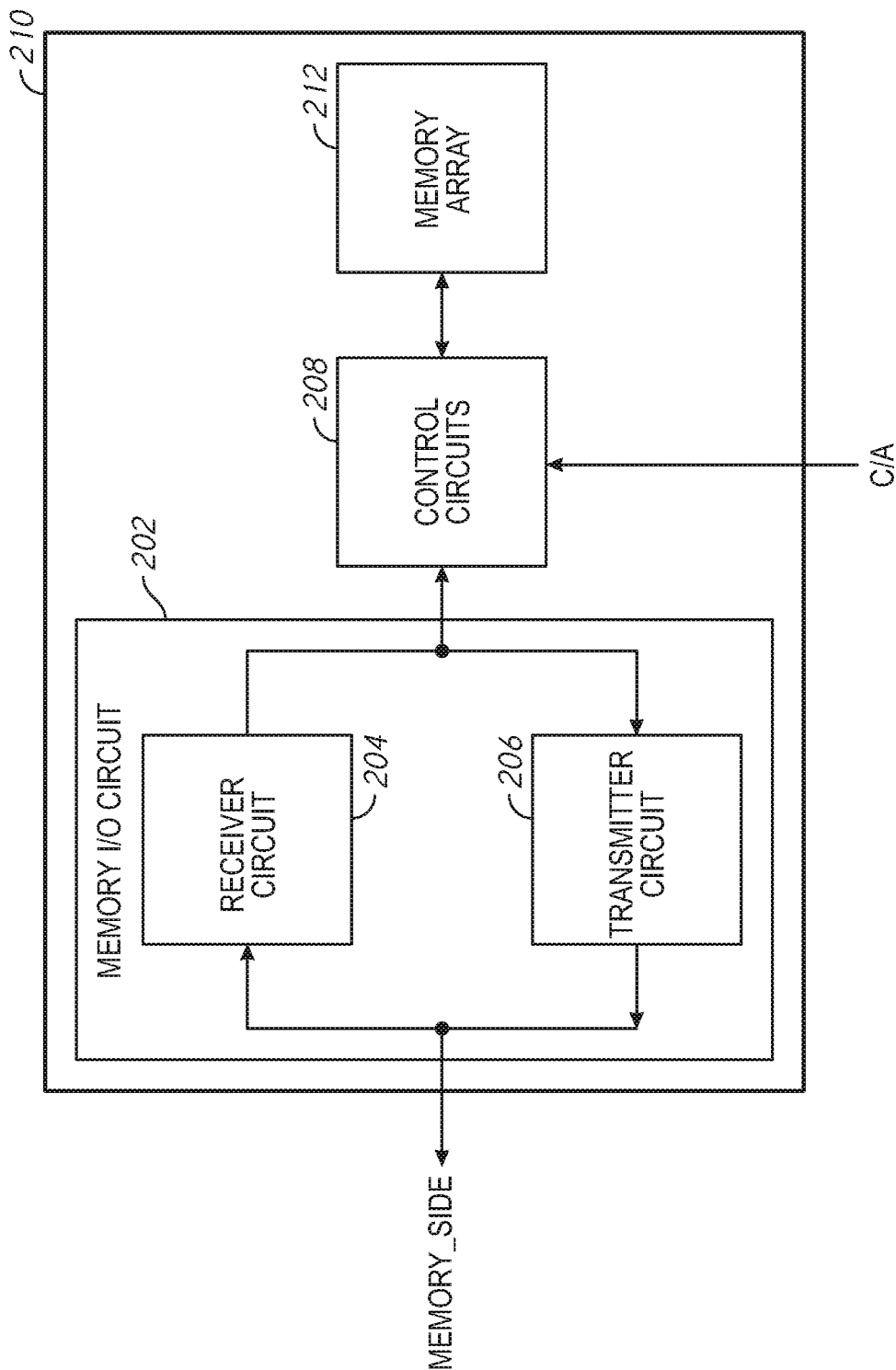
FIG. 2 is a block diagram of a memory, in accordance with an embodiment of the present invention.

FIG. 2 is a block diagram of a memory, generally designated 210, in accordance with an embodiment of the present invention. The memory 210 includes a memory I/O circuit 202, a control circuit 208 and a memory array 212. The memory array 210 may be implemented as one or more of the memories 110(1)-(N) of FIG. 1.

The memory I/O circuit 202 includes a receiver circuit 204 and a transmitter circuit 206. The receiver circuit 204 may be configured to receive the MEMORY_SIDE signal encoded according to the second communications protocol. In embodiments where the MEMORY_SIDE signal is a multilevel signal, the receiver circuit 204 may include, for example, one or more multilevel receivers and a decoder circuit. The transmitter circuit 206 may be configured to provide the MEMORY_SIDE signal encoded according to the second communications protocol. The transmitter circuit 206 may include, for example, one or more signal driver circuits. In embodiments where the MEMORY_SIDE signal is a multilevel signal, the transmitter circuit 206 may include a multilevel driver circuit.

The control circuit 208 may be configured to provide control signals to the memory array 212 based on received command/address information, such as that provided by the command/address buffer 106 of FIG. 1. The control circuit 208 may, for example, provide control signals to the memory array 212 to execute a read operation, a write operation, a refresh operation, or any other memory operation.

The memory array 212 may include a plurality of memory cells. The memory cells may be volatile or non-volatile memory cells. For example, the memory cells may be DRAM memory cells, flash memory cells, phase change memory cells, or any other type of memory cells. The memory cells of the memory array 212 may be arranged in any architecture.

Figure 3:
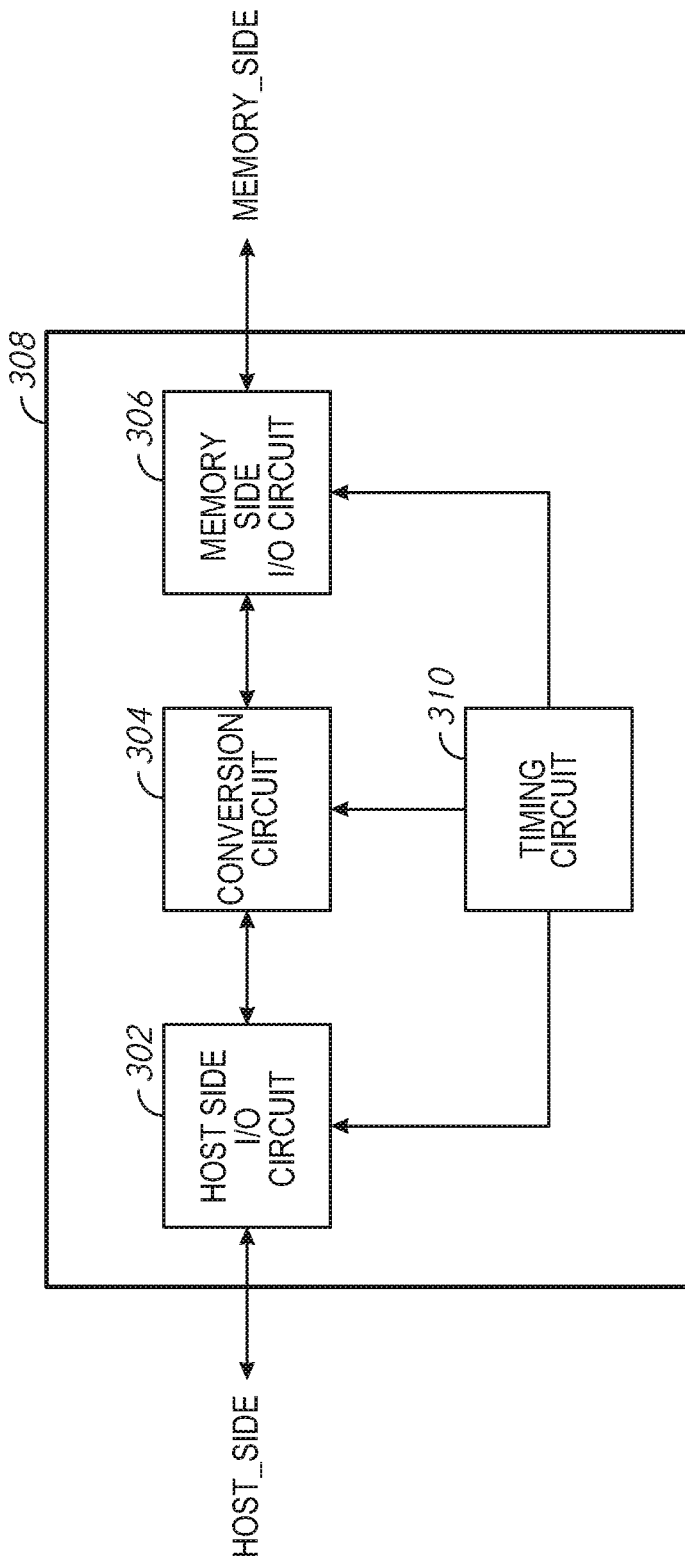
FIG. 3 is a block diagram of a data buffer, in accordance with an embodiment of the present invention.

FIG. 3 is a block diagram of a data buffer, generally designated 308, in accordance with an embodiment of the present invention. The data buffer 308 may be implemented as one or more of the data buffers 108(1)-(N) of FIG. 1. The data buffer 308 may include a host side I/O circuit 302, a conversion circuit 304, a memory side I/O circuit 306, and a timing circuit 310. The data buffer 308 may be a bidirectional buffer configured to convert a HOST_SIDE signal encoded according to a first communication protocol to a MEMORY_SIDE signal encoded according to a second communications protocol and vice versa.

The host side I/O circuit 302 may be configured to receive and provide the HOST_SIDE signal encoded according to a first communications protocol. The host side I/O circuit may include, for example, one or more latches, signal driver circuits, or other circuits for receiving and sending signals. In one embodiment the host side I/O circuit 302 comprises a binary transmitter and a binary receiver circuit. In general, the host side I/O circuit 302 may include any receiver and/or transmitter configured to send and receive signals encoded according to the first communications protocol. An example host side I/O circuit 302 is described in further detail below with respect to FIG. 4.

The conversion circuit 304 may be configured to convert the HOST_SIDE signal encoded according to a first protocol and received by the host side I/O circuit 302 to the MEMORY_SIDE signal encoded according to a second communications protocol and vice versa. The conversion circuit 304 may include, for example, a deserializer circuit for converting serial binary signals (e.g., the HOST_SIDE signal) to parallel binary signals, which may then be converted into a multilevel signal (e.g., the MEMORY_SIDE signal). The conversion circuit 304 may also include, for example, a serializer circuit for converting parallel binary signals (e.g., derived from a multilevel, MEMORY_SIDE signal) and converting them into serial binary signals for transmission as a binary signal (e.g., the HOST_SIDE signal). In various other embodiments, the conversion circuit 304 may convert between other types of communications protocols. Example conversion circuits are described in further detail below with respect to FIGS. 4-8.

The memory side I/O circuit 306 may be configured to receive and provide the MEMORY_SIDE signal encoded accorded to a second communications protocol. The memory side I/O circuit 306 may include, for example, receiver circuits and transmitter circuits. In some embodiments, the receiver circuits and transmitter circuits are configured to receive and provide a multilevel MEMORY_SIDE signal, respectively. In such embodiments, the memory side I/O circuit 306 may further include decoder circuits for decoding a received multilevel MEMORY_SIDE signal.

The timing circuit 310 may be configured to control the timing of signals in the host side I/O circuit 302, the conversion circuit 310, and/or the memory side I/O circuit 306. In various embodiments, the timing circuit may provide one or more clock signals and may be, for example, a phase locked loop (PLL) or a delay locked loop (DLL). In embodiments where the data buffer 308 is configured to convert between a binary HOST_SIDE signal and a multilevel MEMORY_SIDE signal, the timing circuits may be configured to provide a first clock signal have a first frequency to the host side I/O circuit 302 and to provide a second clock signal having a second frequency to the memory side I/O circuit 306. In some embodiments, the second frequency may be half the first frequency. Although shown as part of the data buffer 308, those skilled in the art will appreciate that the timing circuit 310 may be located externally to the data buffer 308. For example, the timing circuit may be a separate circuit in the memory device 104.

Figure 4:
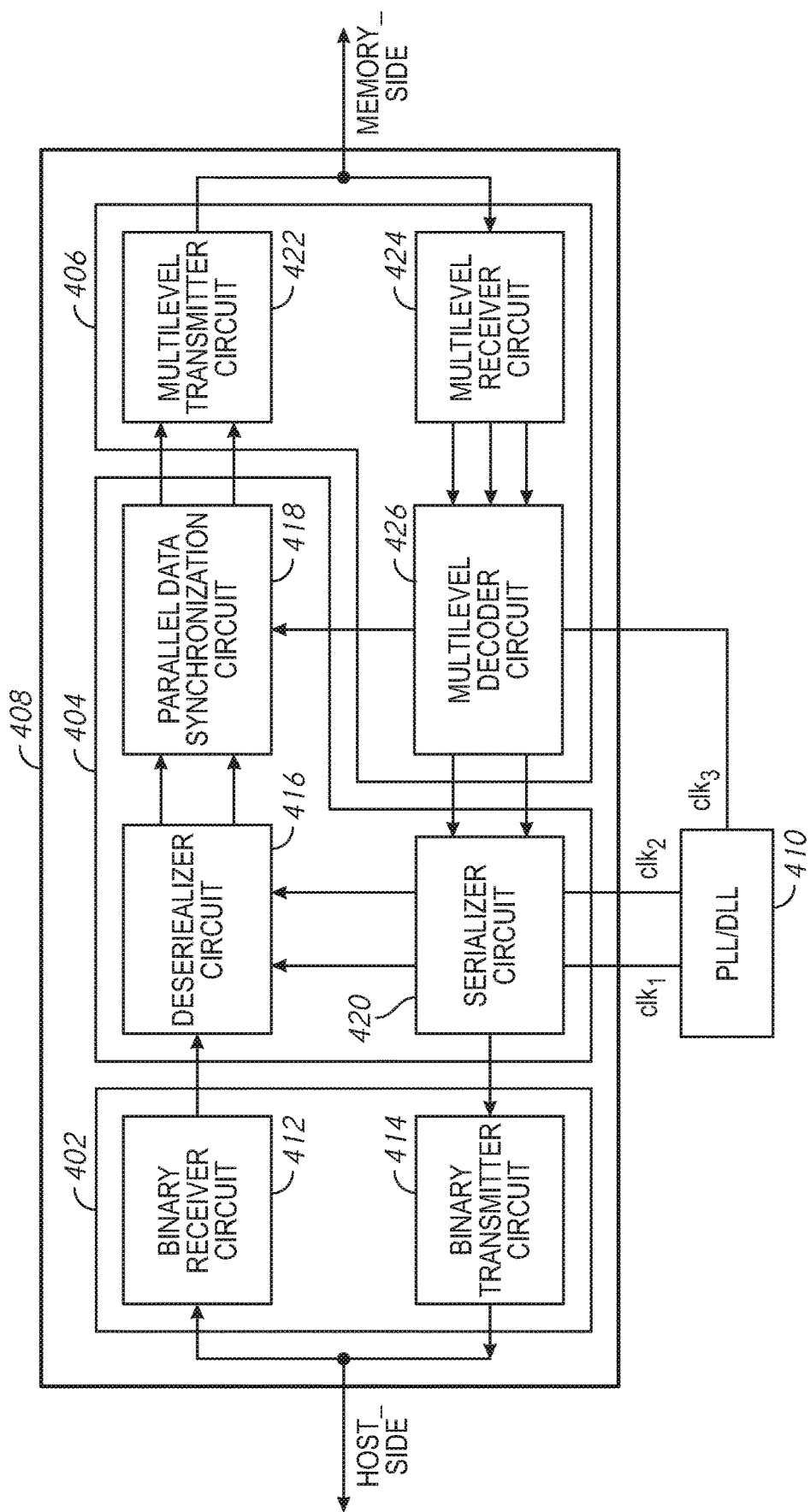
FIG. 4 is a block diagram of a data buffer for converting between a binary signal and a multilevel signal, in accordance with an embodiment of the present invention.

FIG. 4 is a block diagram of a data buffer, generally designated 408, for converting between a binary signal and a multilevel signal, in accordance with an embodiment of the present invention. As described with respect to FIG. 4, the HOST_SIDE signal is a binary signal and the MEMORY_SIDE signal is a multilevel signal. However, those skilled in the art will appreciate that the data buffer 408 may be reversed such that the HOST_SIDE signal is a multilevel signal and the MEMORY_SIDE signal is a binary signal. The data buffer 408 may be implemented as the data buffer 308 of FIG. 3 and/or one or more of the data buffers 108(1)-(N) of FIG. 1. The data buffer 408 may include a host side I/O circuit 402, a conversion circuit 404, and a memory side I/O circuit 406, which may be implemented as the host side I/O circuit 302, the conversion circuit 304, and the memory side I/O circuit 306 of FIG. 3, respectively.

The host side I/O circuit 402 includes a binary receiver circuit 412 and a binary transmitter circuit 414. The binary receiver circuit 412 may be a circuit configured to receive a binary HOST_SIDE signal and to provide the received signal to the conversion circuit 404. The binary receiver circuit 412 may include, for example, an amplifier circuit configured to amplify the received HOST_SIDE signal. The binary receiver circuit 412 may include additional filtering or equalization circuits, such as a decision feedback equalizer. Generally, the binary receiver circuit 412 may be any circuit that can receive and propagate a serial binary signal.

The binary transmitter circuit 414 may be a circuit configured to provide a binary HOST_SIDE signal. The binary transmitter circuit 414 may include, for example, one or more driver circuits configured to drive the binary HOST_SIDE signal. In various embodiments, the binary transmitter circuit may be configured to provide the binary HOST_SIDE signal based on a clock signal having a first frequency.

Figure 6:
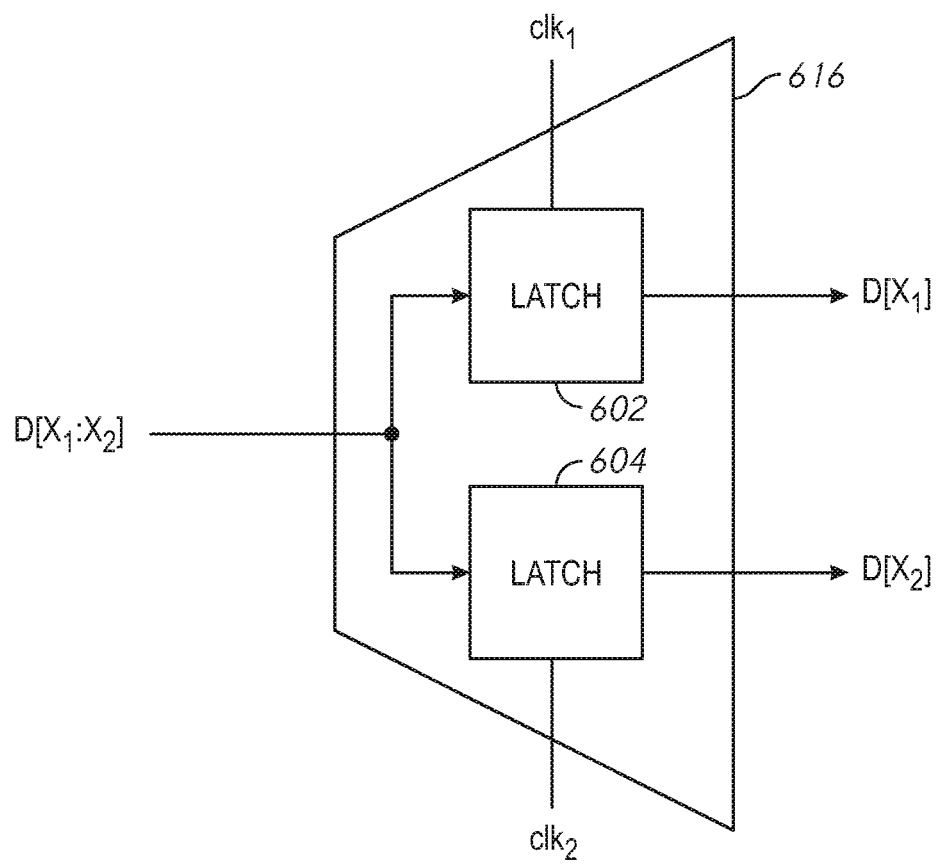
FIG. 6 is a block diagram of a deserializer circuit, in accordance with an embodiment of the present invention.

In the embodiment of FIG. 4, the conversion circuit 404 may be configured to convert serial data bits into parallel data bits and to convert parallel data bits into serial data bits. The parallel data bits may then encoded as or decoded from a multilevel signal (e.g., the MEMORY_SIDE signal) and the serial data bits may be encoded as or decoded from a binary signal (e.g., the HOST_SIDE signal). The conversion circuit 404 may include a deserializer circuit 416, a parallel data synchronization circuit 418, and a serializer circuit 420. The deserializer circuit 416 may be configured to receive the binary HOST_SIDE signal from the binary receiver circuit 412, convert received serial bits of the binary HOST_SIDE signal into a parallel signal and provide the parallel signal to the parallel data synchronization circuit 418. An example deserializer circuit 616 is shown in FIG. 6. The deserializer circuit 616 may include a first latch 602 and a second latch 604. A serial binary signal D may be provided to the first latch 602 and the second latch 604. The signal D may be received, for example, from the binary receiver circuit 412. As shown in FIG. 6, the signal D includes a first data bit $D[X_1]$ and a second data bit $D[X_2]$. The first latch 602 may be configured to latch the first data bit $D[X_1]$ at a first time based on a first clock signal $clk_1$, which may be provided by a timing circuit, such as the PLL/DLL 410. The second latch 604 may be configured to latch the second data bit $D[X_2]$ at a second time based on a second clock signal $clk_2$, which may be provided by a timing circuit, such as the PLL/DLL 410. The first clock signal $clk_1$ and the second clock signal $clk_2$ may be complementary. The first and second latches 602 and 604 may output the first and second bits $D[X_1]$ and $D[X_2]$, respectively, in parallel.

Returning again to FIG. 4, the parallel data synchronization circuit 418 may be configured to receive parallel data bits (e.g., parallel data bits $D[X_1]$ and $D[X_2]$) and to provide synchronized parallel data bits (e.g., align the rising and/or falling edges of the data signals with a common clock signal). The data synchronization circuit 418 may include one or more latches, passgates, or other circuits that are configured to synchronize the parallel data bits $D[X_1]$ and $D[X_2]$ based on a third clock signal $clk_3$ provided by the PLL/DLL circuit 410. In various embodiments, the third clock signal $clk_3$ may have a frequency that is double the frequency of the first clock signal $clk_1$ and the second clock signal $clk_2$.

Figure 7:
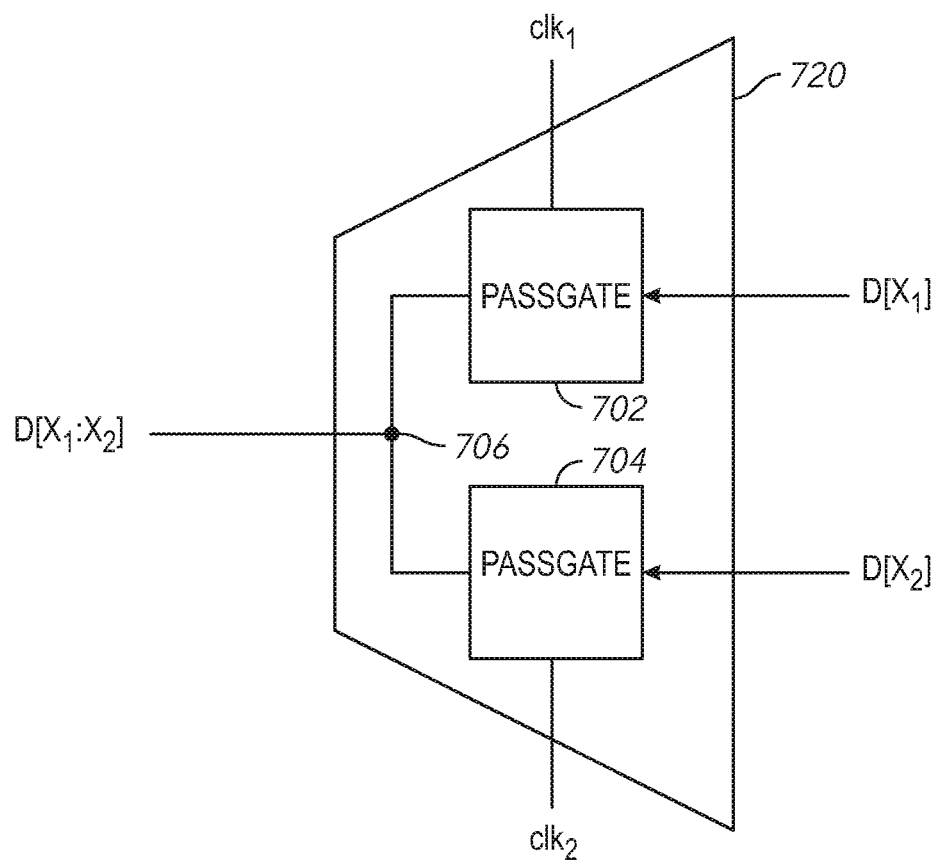
FIG. 7 is a block diagram of a serializer circuit, in accordance with an embodiment of the present invention.

The serializer circuit 420 may be configured to receive parallel data bits and to provide the data bits in a serial binary signal. The serializer circuit may provide the binary signal based on a first clock signal $clk_1$ and a second clock signal $clk_2$. The serializer circuit 420 may include, for example, passgates for controlling the transmission of the data bits based on the first and second clock signals. An example serializer circuit 720 is shown in FIG. 7. The serializer circuit 720 may be implemented as the serializer circuit 420 of FIG. 4. The serializer circuit includes a first passgate 702 and a second passgate 704. The first passgate 702 and the second passgate 704 may be, for example, transistors. The first passgate is configured to receive a first parallel data bit $D[X_1]$ and a first clock signal $clk_1$. The second passgate 704 is configured to receive a second parallel data bit $D[X_2]$ and a second clock signal $clk_2$. The first clock signal $clk_1$ and the second clock signal $clk_2$ may be complementary clock signals. The first passgate 702 and the second passgate may have output terminals that are coupled to a common node 706. In operation, the first passgate 702 may be configured to provide the first parallel data bit $D[X_1]$ to the common node 706 when the first clock signal $clk_1$ is active (e.g., logic high) and the second passgate 704 may be configured to provide the second parallel data bit $D[X_2]$ to the common node when the second clock signal $clk_2$ is active. In embodiments where the first clock signal $clk_1$ and the second clock signal $clk_2$ are complementary, the first passgate 702 and the second passgate 704 alternate between providing their respective outputs to the common node 706. Thus, the resulting output signal of the serializer circuit 720 is a serial binary signal $D[X_1:X_2]$. Returning again to FIG. 4, the output of the serializer circuit 420 may be provided to the binary transmitter circuit 414 to be encoded as a binary signal (e.g., the HOST_SIDE signal).

The memory side I/O circuit 406 is configured to receive and provide a multilevel memory signal (e.g. the MEMORY_SIDE signal). The memory side I/O circuit 406 includes a multilevel transmitter circuit 422, a multilevel receiver circuit 424, and a multilevel decoder circuit 426.

Figure 8:
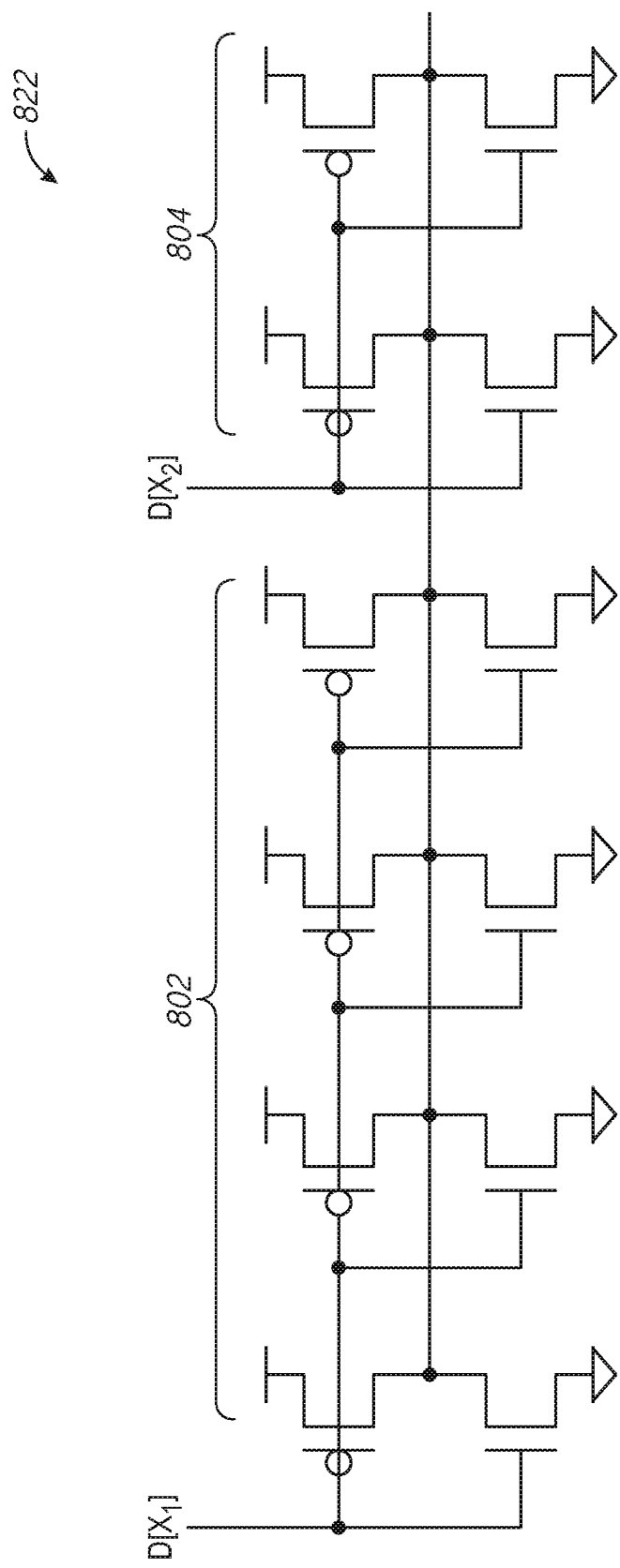
FIG. 8 is a circuit diagram of a multilevel transmitter circuit, in accordance with an embodiment of the present invention.

The multilevel transmitter circuit 422 may be configured to receive parallel data bits and to encode the parallel data bits as a multilevel signal. The multilevel transmitter circuit 422 may include one or more driver circuits. For example, the multilevel transmitter circuit may include a plurality of driver legs configured to drive a multilevel signal based on the parallel data bits. An example multilevel transmitter circuit 822 is shown in FIG. 8. The multilevel transmitter circuit 822 may be implemented as the multilevel transmitter circuit 422 of FIG. 4. The multilevel transmitter 822 includes a first plurality of driver legs 802 and a second plurality of driver legs 804. In the embodiment of FIG. 8, the first plurality of driver legs 802 includes four driver legs while the second plurality of driver legs includes two driver legs. However, other numbers and combinations of driver legs may also be used. Each driver leg may include a pair of transistors coupled in series between a first voltage (e.g., Vcc) and a second voltage (e.g., ground). Nodes between the first and second transistors may be coupled in common and configured to provide the MEMORY_SIDE signal. The first plurality of driver legs may be configured to be activated based on a first parallel data bit $D[X_1]$, which may be received from the parallel data synchronization circuit 418 of FIG. 4. The second plurality of driver legs 804 may be configured to be activated based on a second parallel data bit $D[X_2]$, which may be received from the parallel data synchronization circuit 418 of FIG. 4.

In operation, the drive strength of the multilevel transmitter circuit 822 is adjusted based on the value of the parallel data bits. For example, if $D[X_1]$ and $D[X_2]$ are both logic low signals, then the MEMORY_SIDE signal may be driven at a first voltage by both pluralities of driver legs 802 and 804. If $D[X_1]$ is logic low and $D[X_2]$ is logic high, then the MEMORY side signal may be driven at a second voltage by only the first plurality of driver legs 802. If $D[X_1]$ is logic high and $D[X_2]$ is logic low, then the MEMORY side signal may be driven at a third voltage by only the second plurality of driver legs 804. If $D[X_1]$ and $D[X_2]$ are both logic high signals, then the MEMORY_SIDE signal may be pulled to ground by both pluralities of driver legs 802 and 804.

Returning again to FIG. 4, the multilevel receiver circuit 424 may be configured to receive the multilevel MEMORY_SIDE signal and to compare the received MEMORY_SIDE signal to one or more reference voltages. The multilevel receiver circuit 424 may include one or more comparators to compare the received MEMORY_SIDE signal to the one or more reference voltages and to provide one or more signals indicative of whether the MEMORY_SIDE signal exceeds the one or more reference voltages. The multilevel decoder circuit 426 is configured to receive the output signals of the multilevel receiver circuit 424, to decode the received signals, and to provide parallel data bits that were encoded in the received multilevel MEMORY_SIDE signal.

Figure 9:
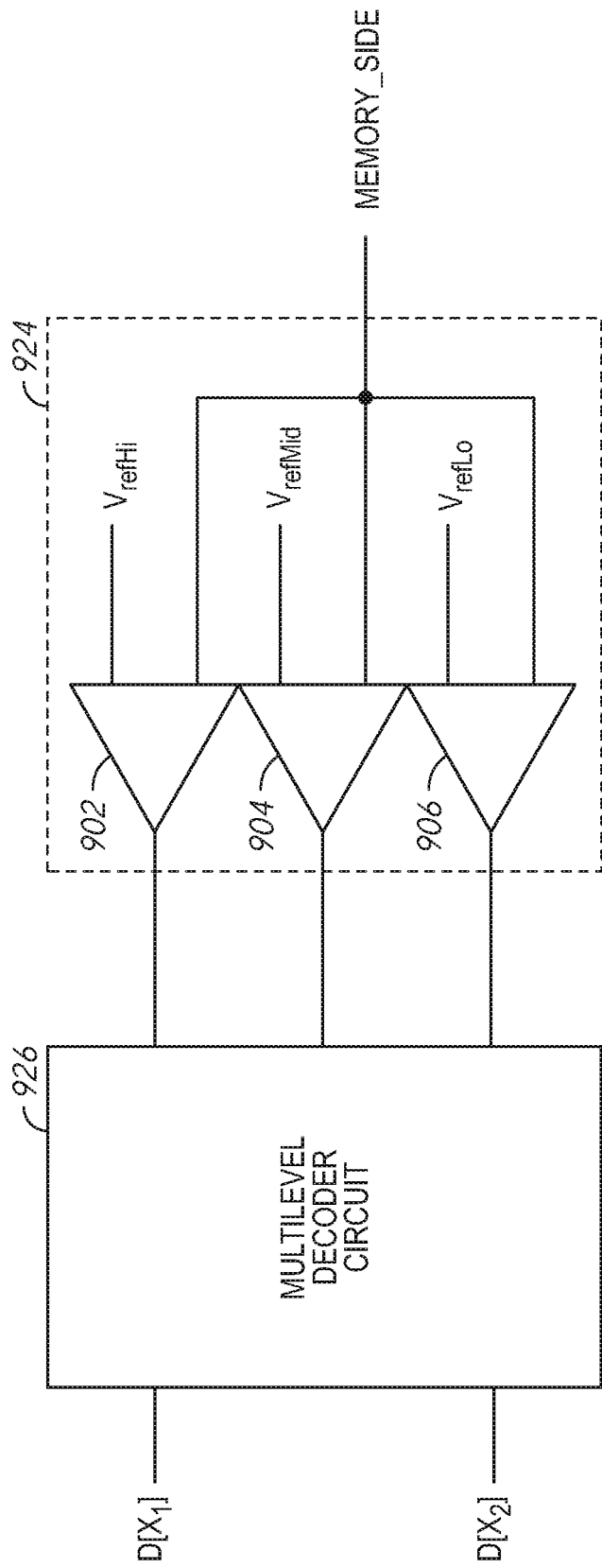
FIG. 9 is a block diagram of a multilevel receiver and a multilevel decoder circuit, in accordance with an embodiment of the present invention.

An example multilevel receiver circuit 924 is shown in FIG. 9. The multilevel receiver circuit 924 may be implemented as the multilevel receiver circuit 424. The multilevel receiver circuit 924 may be configured to receive a MEMORY_SIDE signal that encodes two data bits per symbol (e.g., each symbol may have one of four voltage levels corresponding to logic states 00, 01, 10, and 11). The multilevel receiver circuit 924 may include a first comparator 902, a second comparator 904, and a third comparator 906. The first comparator 902 may be configured to receive the MEMORY_SIDE signal and a first reference voltage $V_{refHi}$. The first comparator 902 may provide a first output signal indicative of whether a voltage the MEMORY_SIDE signal exceeds the first reference voltage $V_{refHi}$. The second comparator 904 may be configured to receive the MEMORY_SIDE signal and a second reference voltage $V_{refMid}$. The second comparator 904 may provide a second output signal indicative of whether a voltage the MEMORY_SIDE signal exceeds the second reference voltage $V_{refMid}$. The third comparator 906 may be configured to receive the MEMORY_SIDE signal and a third reference voltage $V_{refLo}$. The third comparator 906 may provide a third output signal indicative of whether a voltage the MEMORY_SIDE signal exceeds the third reference voltage $V_{refLo}$. The first, second, and third reference voltages may be indicative of boundaries between different logic states of the multilevel MEMORY_SIDE signal. Thus, the outputs of the comparators 902-906 are indicative of logic state of the MEMORY_SIDE signal.

As an example, if the MEMORY_SIDE signal is less than all three of the reference voltages $V_{refHi}$, $V_{refMid}$, and $V_{refLo}$, then the comparators 902-906 may all provide a logic low output signal. If the MEMORY_SIDE signal is greater than all three of the reference voltages $V_{refHi}$, $V_{refMid}$, and $V_{refLo}$, then the comparators 902-906 may all provide a logic high output signal. If the MEMORY_SIDE signal is less than the first reference voltage $V_{refHi}$, but greater than the second reference voltage $V_{refMid}$, and the third reference voltage $V_{refLo}$, then the comparator 902 may provide a logical low output signal and the comparators 904 and 906 may provide logical high output signals. If the MEMORY_SIDE signal is less than the first reference voltage $V_{refHi}$ and the second reference voltage $V_{refMid}$, but greater than the third reference voltage $V_{refLo}$, then the comparators 902 and 904 may provide a logical low output signal and the comparator 906 may provide a logical high output signal.

The multilevel decoder circuit 926 may include logic to decode the output signals of the multilevel receiver circuit 924 and to provide parallel data bits $D[X_1]$ and $D[X_2]$ (e.g., as parallel binary signals). In various embodiments, different combinations of output signals from the multilevel receiver circuit 924 correspond to different logic states of the MEMORY_SIDE signal. For example, if all three output signals of the multilevel receiver circuit are logic low, that state may correspond to a logic 00 state of the MEMORY_SIDE signal. The multilevel decoder circuit 926 may interpret the received output signal from the multilevel receiver circuit 924 and provide parallel data bits D[X$_1$] and D[X$_2$] both with voltage levels indicating logic 0. Similarly, if all three output signals of the multilevel receiver circuit are logic high, that state may correspond to a logic 11 state of the MEMORY_SIDE signal. The multilevel decoder circuit 926 may interpret the received output signal from the multilevel receiver circuit 924 and provide parallel data bits D[X$_1$] and D[X$_2$] both with voltage levels indicating logic 1. Other combinations of output signals may be decoded to provide parallel data bits D[X$_1$] and D[X$_2$] as 0 and 1 or 1 and 0, respectively. Returning again to FIG. 4, the parallel data bits D[X$_1$] and D[X$_2$] may be provided by the multilevel decoder circuit 426 to the serializer circuit 420 and processed as described above.

Figure 5:
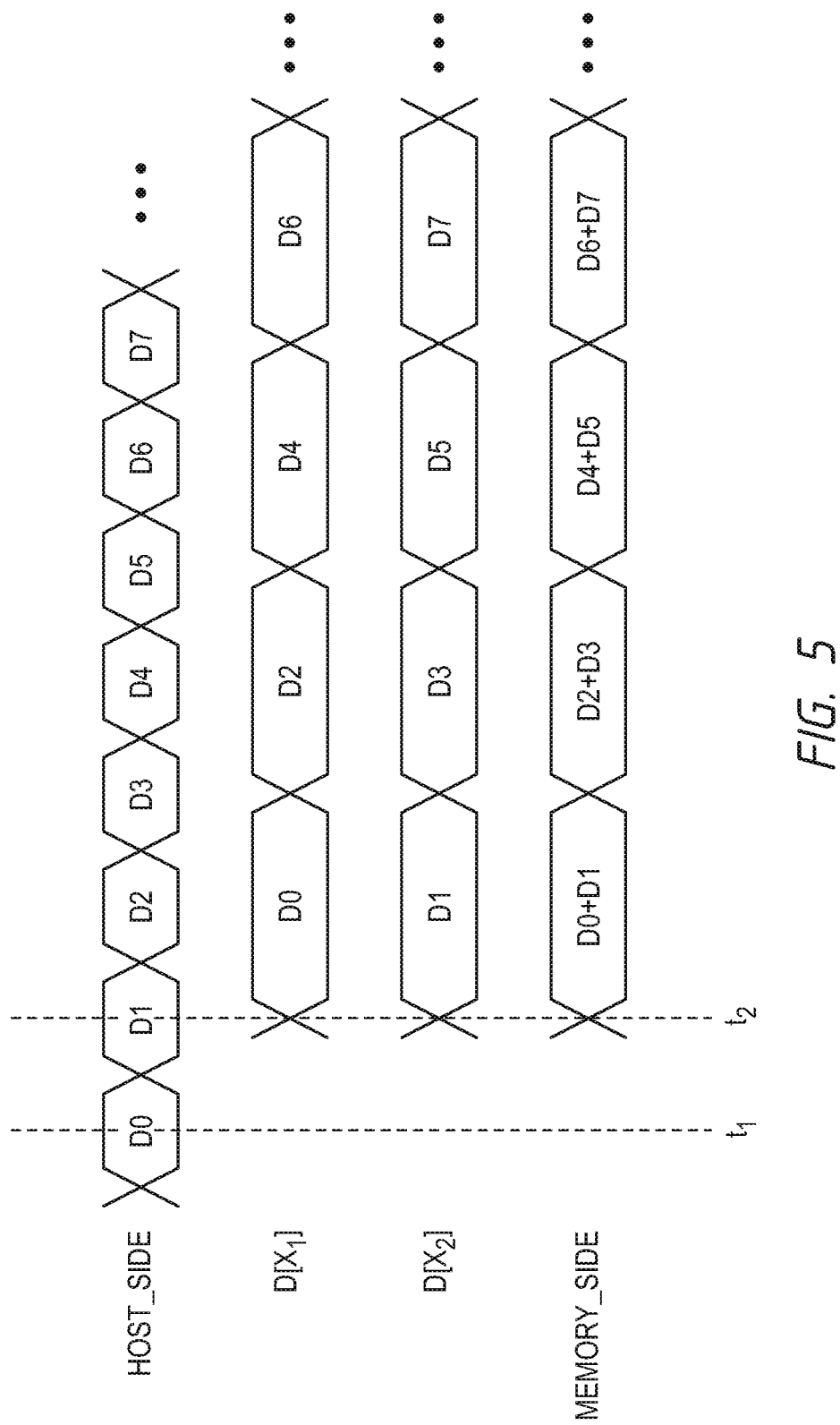
FIG. 5 is a timing diagram for a data buffer for converting a binary signal to a multilevel signal, in accordance with an embodiment of the present invention.

FIG. 5 is a timing diagram for a data buffer converting a binary HOST_SIDE signal to a multilevel MEMORY_SIDE signal, in accordance with an embodiment of the present invention. The HOST-SIDE signal may be a series of binary data bits D0-DN. For clarity, only data bits D0-D7 are shown in FIG. 5. The HOST_SIDE signal may have a first frequency. The HOST_SIDE signal may be received by the binary receiver circuit 412 and provided to the deserializer circuit 416. At times t$_1$ and t$_2$, the first and second data bits D0 and D1 may be latched, respectively, by the deserializer circuit 416, as described above with respect to FIGS. 4 and 6. The parallel data synchronization circuit 418 may synchronize the first and second data bits D0 and D1 and provide parallel data bits D[X$_1$] and D[X$_2$]. The parallel data bits D[X$_1$] and D[X$_2$] may be clocked with a frequency that is half the frequency of the HOST_SIDE signal. Based on the parallel data bits D[X$_1$] and D[X$_2$], the multilevel transmitter circuit 422 may encode the first and second data bits D[X$_1$] and D[X$_2$] as a multilevel MEMORY_SIDE signal. As shown in FIG. 5, each data symbol of the MEMORY_SIDE signal encodes two data bits (e.g., D0 and D1, D2 and D3, etc.). The MEMORY_SIDE signal may be clocked with a frequency that is half the frequency of the HOST_SIDE signal. However, because each data symbol of the MEMORY_SIDE signal encodes two data bits, the bandwidth of the HOST_SIDE signal and the MEMORY_SIDE signal is maintained. Because the MEMORY_SIDE signal is clocked at half the frequency of the HOST_SIDE signal, the negative impact of transistor response time within the memory on the bandwidth of data transmitted may be reduced, and the performance of the memory may be improved.

Figure 10:
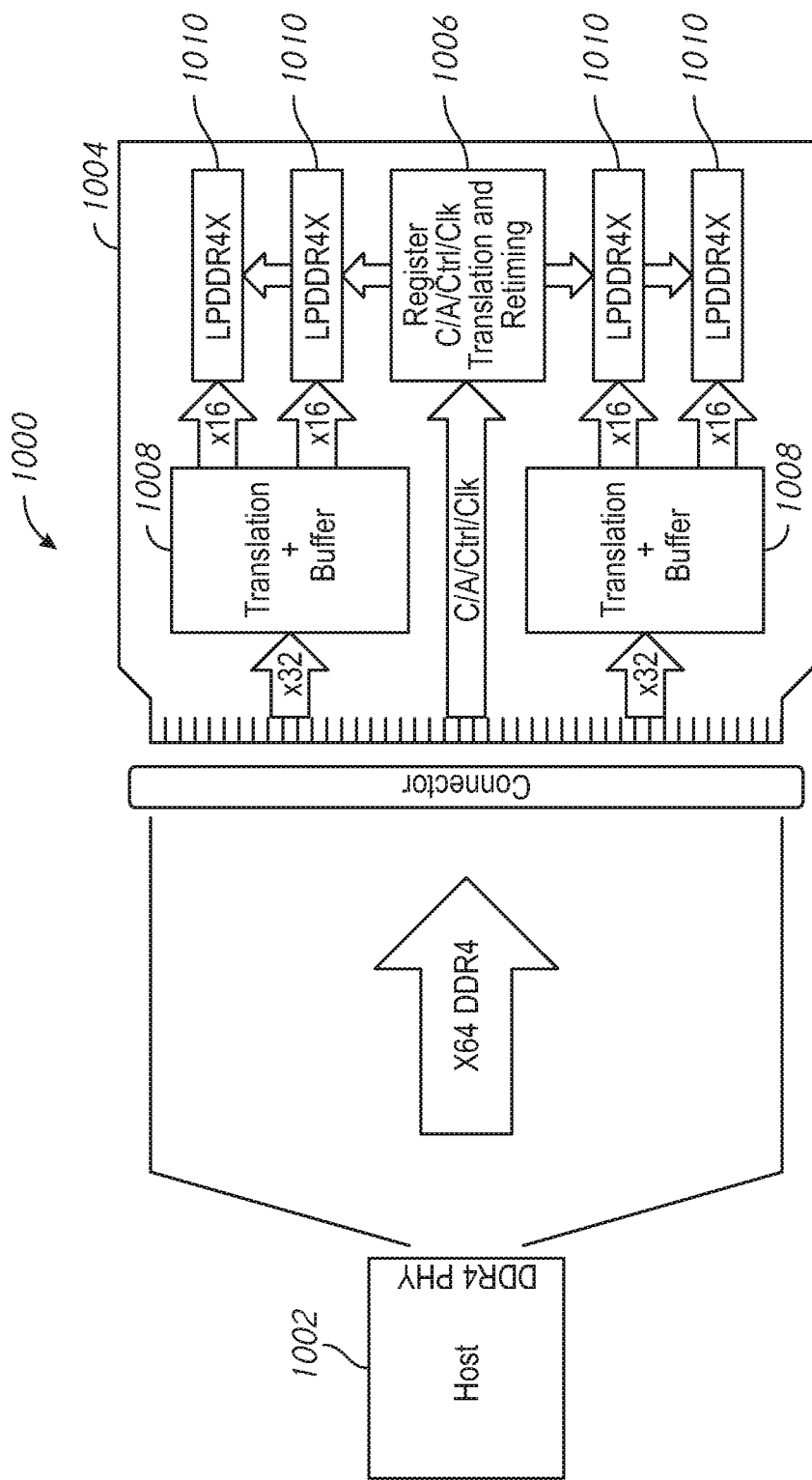
FIG. 10 is a block diagram of a buffered memory system, in accordance with an embodiment of the present invention.

While FIGS. 4-9 describe a data buffer that is configured to convert between a binary HOST_SIDE signal and a multilevel MEMORY_SIDE signal, data buffers may be used to convert between other types of communications protocols used by memory devices. FIG. 10 is a block diagram of a buffered memory system 1000 having a data buffer for translating between a standard DDR4 communications protocol and an LPDDR4x protocol, in accordance with an embodiment of the present invention. The memory system 1000 includes a host 1002 and a memory device 1004. The host 1002 may be implemented as described above with respect to the host 102 of FIG. 1. In the embodiment of FIG. 10, the host 1002 is configured to communicate with the memory device 1004 using a 64-bit bus to communicate using a DDR4 communications protocol.

The memory device 1004 includes a pair of data buffers 1008, a register 1006, and a plurality of LPDDR4x memories. Each of the data buffers 1008 may implemented as one or more of the data buffers 108(1)-(N) of FIG. 1 or data buffer 308 of FIG. 3. Each data buffer 1008 may be configured to receive 32 bits of the 64 bit DDR4 signal. Each data buffer 1008 includes translation circuits to convert the 32 bit DDR4 signal to two 16 bit wide internal signals encoded using an LPDDR4x communications protocol. The data buffers 1008 may provide each the 16 bit LPDDR4x signals to an LPDDR4x memory 1010. The LPDDR4x memories 1010 may be implemented as one or more of the memories 110(1)-(N) of FIG. 1 or the memory 210 of FIG. 2. The host 1002 may also provide command/address/control/clock information to the memory device 1004. The command/address/control/clock information may be provided to the register 1006, which may translate and/or retime the received information in accordance with the LPDDR4x communications protocol. The translated command/address/control/clock information may then be provided to one or more of the LPDDR4x memories 1010.

Figure 11:
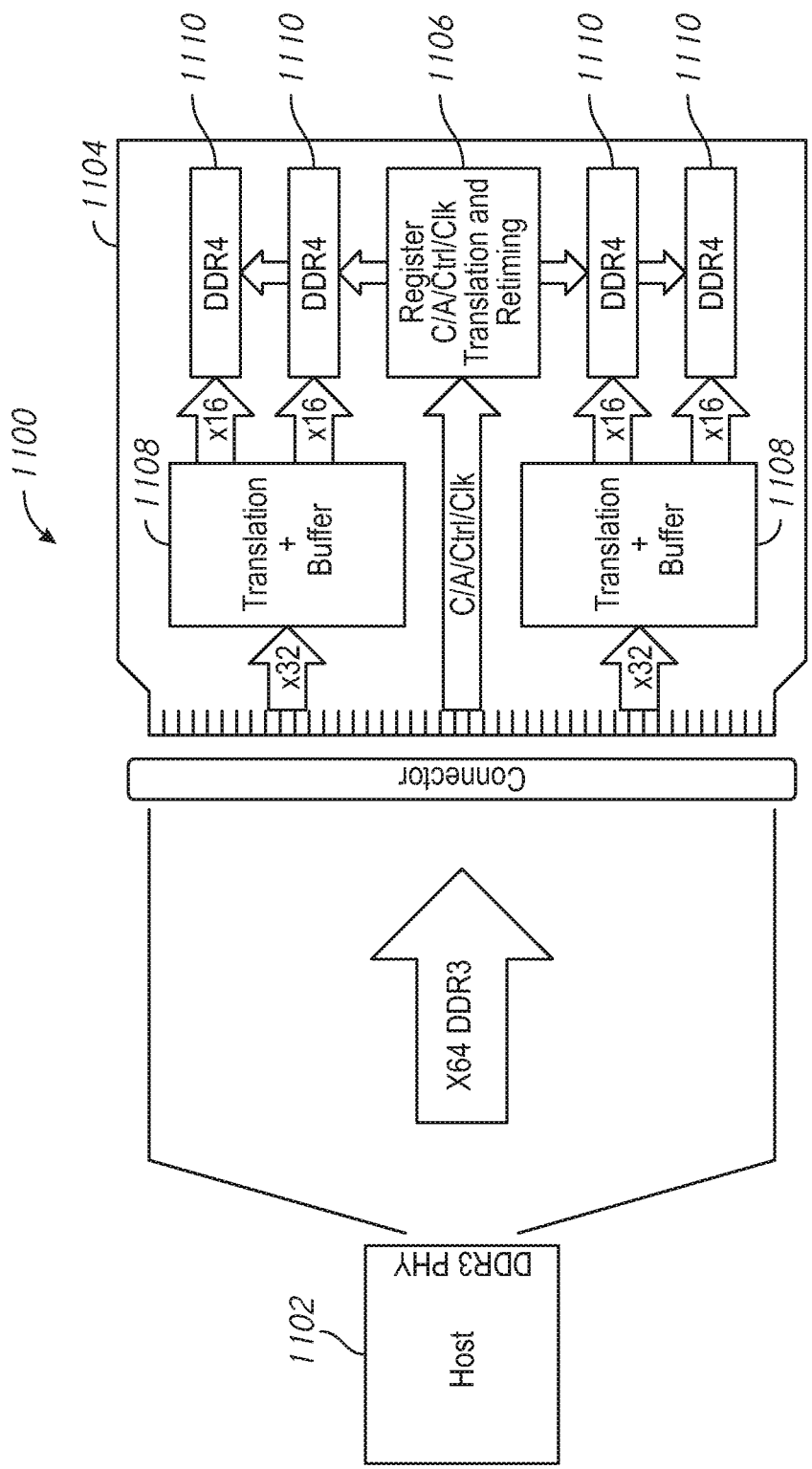
FIG. 11 is a block diagram of a buffered memory system, in accordance with an embodiment of the present invention.

FIG. 11 is a block diagram of a buffered memory system 1100 having a data buffer for translating between a standard DDR3 communications protocol and a DDR4 communications protocol, in accordance with an embodiment of the present invention. The memory system 1100 includes a host 1102 and a memory device 1104. The host 1102 may be implemented as described above with respect to the host 102 of FIG. 1. In the embodiment of FIG. 11, the host 1102 is configured to communicate with the memory device 1104 using a 64-bit bus to communicate using a DDR3 communications protocol.

The memory device 1104 includes a pair of data buffers 1108, a register 1106, and a plurality of DDR4 memories. Each of the data buffers 1108 may implemented as one or more of the data buffers 108(1)-(N) of FIG. 1 or data buffer 308 of FIG. 3. Each data buffer 1108 may be configured to receive 32 bits of the 64 bit DDR3 signal. Each data buffer 1108 includes translation circuits to convert the 32 bit DDR3 signal to two 16 bit wide internal signals encoded using an DDR4 communications protocol. The data buffers 1108 may provide each the 16 bit DDR4 signals to a DDR4 memory 1110. The DDR4 memories 1110 may be implemented as one or more of the memories 110(1)-(N) of FIG. 1 or the memory 210 of FIG. 2. The host 1102 may also provide command/address/control/clock information to the memory device 1104. The command/address/control/clock information may be provided to the register 1106, which may translate and/or retime the received information in accordance with the DDR4 communications protocol. The translated command/address/control/clock information may then be provided to one or more of the DDR4 memories 1110.

Figure 12:
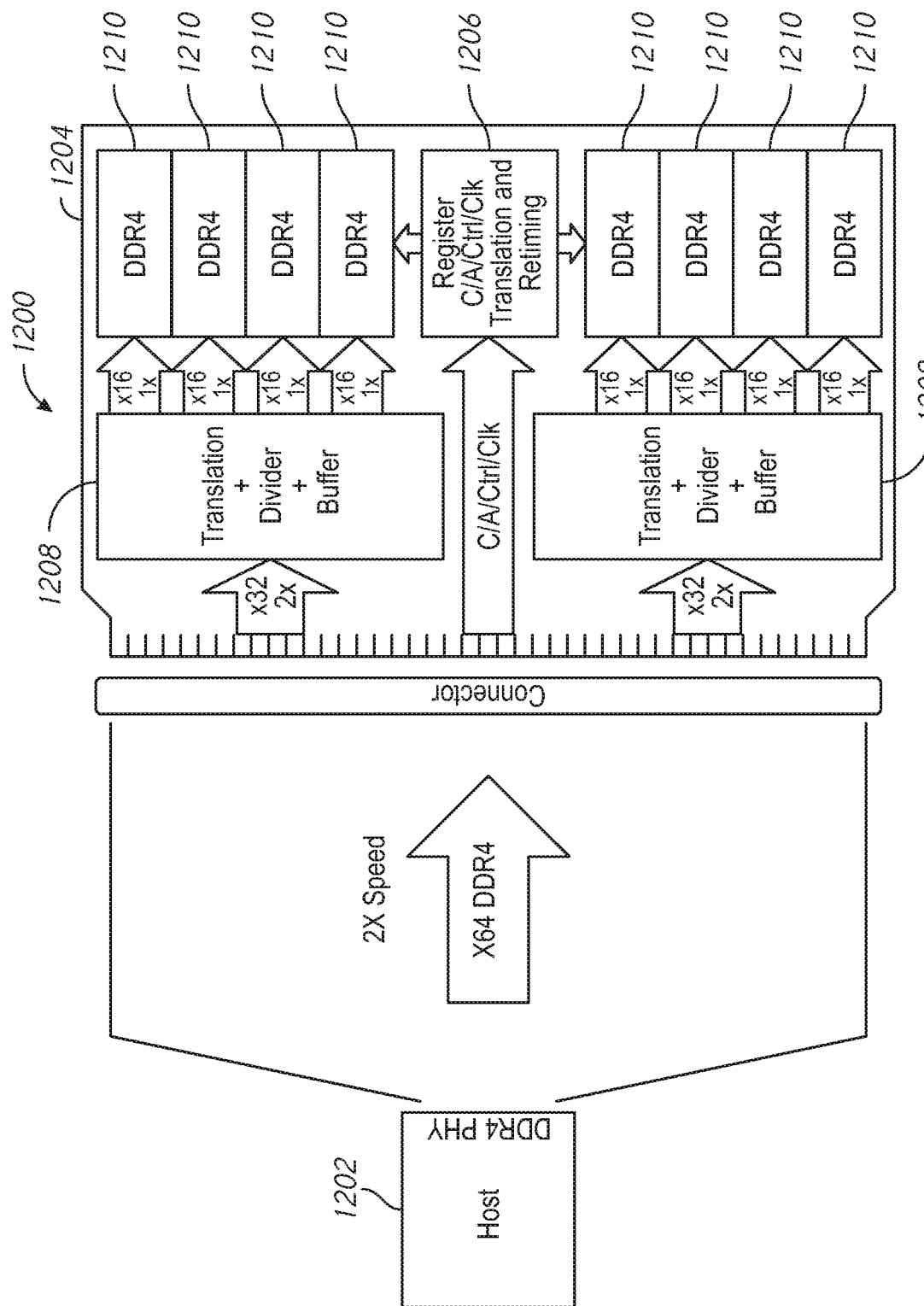
FIG. 12 is a block diagram of a buffered memory system, in accordance with an embodiment of the present invention.

FIG. 12 is a block diagram of a buffered memory system 1200 having a data buffer for translating between a DDR4 communications protocol clocked at a first frequency and an internal DDR4 communications protocol clocked at a second frequency that is slower than the first frequency, in accordance with an embodiment of the present invention. The memory system 1200 includes a host 1202 and a memory device 1204. The host 1202 may be implemented as described above with respect to the host 102 of FIG. 1. In the embodiment of FIG. 12, the host 1202 is configured to communicate with the memory device 1204 using a 64-bit bus to communicate using a DDR4 communications protocol. However, in the embodiment of FIG. 12, the 64 bit signal is clocked at a first frequency that is faster than the operating frequency of the memories 1210 within the memory device 1204. In one embodiment, the 62 bit signal from the host 1202 is clocked at two times the frequency of the memories 1210.

The memory device 1204 includes a pair of data buffers 1208, a register 1206, and a plurality of DDR4 memories. Each of the data buffers 1208 may implemented as one or more of the data buffers 108(1)-(N) of FIG. 1 or data buffer 308 of FIG. 3. Each of the data buffers 1208 may be configured to receive 32 bits of the 64 bit DDR4 signal. Each data buffer 1208 includes translation and divider circuits to convert the 32 bit DDR4 signal to four 16 bit wide internal signals encoded using a DDR4 communications protocol but clocked at half of the frequency of the incoming 64 bit signal. Because the incoming 64 bit signal is clocked twice as fast as the internal memories 1210, twice as much data is received by the data buffers 1208 as in the embodiment of FIG. 10. This enables the memory device 1204 to double the bandwidth while maintaining a slower clock speed, thus mitigating the negative effects of transistor reaction time within the memories 1210. The data buffers 1208 may provide each the 16 bit DDR4 signals to a DDR4 memory 1210. The DDR4 memories 1210 may be implemented as one or more of the memories 110(1)-(N) of FIG. 1 or the memory 210 of FIG. 2. The host 1202 may also provide command/address/control/clock information to the memory device 1204. The command/address/control/clock information may be provided to the register 1206, which may translate and/or retime the received information in accordance with the DDR4 communications protocol operating at half of the frequency of the incoming signal. The translated command/address/control/clock information may then be provided to one or more of the DDR4 memories 1210.

Figure 13:
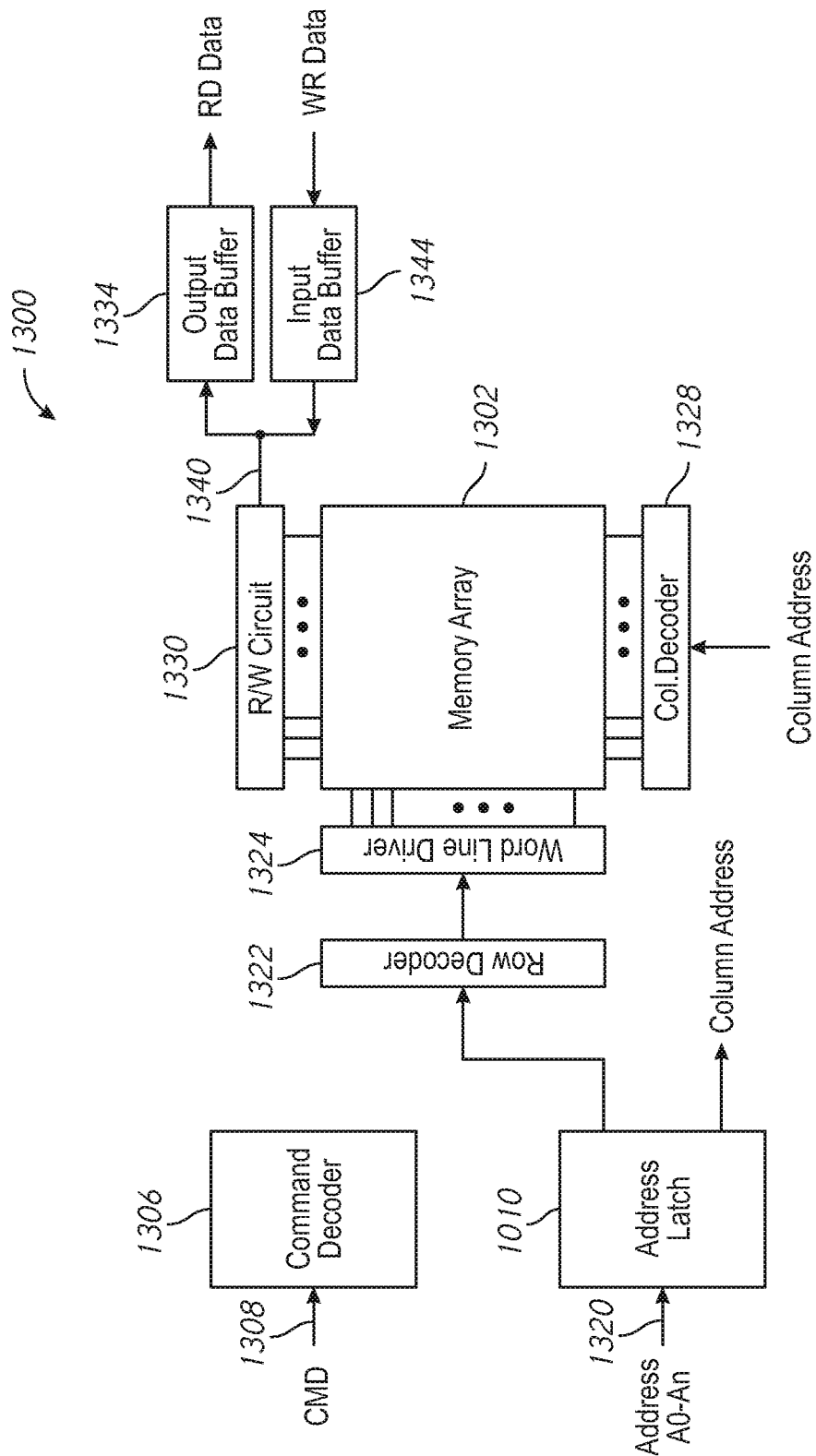
FIG. 13 is a block diagram of a memory, in accordance with an embodiment of the present invention.

FIG. 13 is a block diagram of a memory, according to an embodiment of the invention. The memory 1300 may include an array 1302 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 1300 includes a command decoder 1306 that may receive memory commands through a command bus 1308 and provide (e.g., generate) corresponding control signals within the memory 1300 to carry out various memory operations. For example, the command decoder 1306 may respond to memory commands provided to the command bus 1308 to perform various operations on the memory array 1302. In particular, the command decoder 1306 may be used to provide internal control signals to read data from and write data to the memory array 1302. Row and column address signals may be provided (e.g., applied) to an address latch 1310 in the memory 1300 through an address bus 1320. The address latch 1310 may then provide (e.g., output) a separate column address and a separate row address.

The address latch 1310 may provide row and column addresses to a row address decoder 1322 and a column address decoder 1328, respectively. The column address decoder 1328 may select bit lines extending through the array 1302 corresponding to respective column addresses. The row address decoder 1322 may be connected to a word line driver 1324 that activates respective rows of memory cells in the array 1302 corresponding to received row addresses. The selected data line (e.g., a bit line or bit lines) corresponding to a received column address may be coupled to a read/write circuitry 1330 to provide read data to an output data buffer 1334 via an input-output data path 1340. Write data may be provided to the memory array 1302 through an input data buffer 1344 and the memory array read/write circuitry 1330.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

What is claimed is:

1. An apparatus comprising:
a first data bus having a first width configured to provide a first portion of a first signal;
a data buffer coupled to the first data bus configured to receive the first portion of the first signal and convert the first portion of the first signal to a first portion of a second signal and a second portion of the second signal, wherein the first signal is encoded according to a first protocol and the second signal is encoded according to a second protocol different from the first protocol;
a second data bus coupled to the data buffer having a second width configured to receive the first portion of the second signal, wherein the second width is half the first width;
a third data bus coupled to the data buffer having the second width configured to receive the second portion of the second signal;
a first memory configured to receive the first portion of the second signal from the second data bus; and
a second memory configured to receive the second portion of the second signal from the third data bus.

2. The apparatus of claim 1, further comprising:
a fourth data bus having the first width configured to provide a second portion of the first signal;
a second data buffer coupled to the fourth data bus configured to receive the second portion of the first signal and convert the second portion of the first signal to a third portion of the second signal and a fourth portion of the second signal;
a fifth data bus coupled to the second data buffer having the second width configured to receive the third portion of the second signal;
a sixth data bus coupled to the second data buffer having the second width configured to receive the fourth portion of the second signal;
a third memory configured to receive the third portion of the second signal from the fifth data bus; and
a fourth memory configured to receive the fourth portion of the second signal from the sixth data bus.

3. The apparatus of claim 2, further comprising a connector having a third width coupled to the first data bus and the fourth data bus, wherein the third width is double the first width.

4. The apparatus of claim 1, further comprising a register configured to:
receive information from a host;
translate the information from the first protocol to the second protocol, reline the information, or a combination thereof; and provide the information in the second protocol, the information retimed, or a combination thereof to at least one of the first memory or the second memory.

5. The apparatus of claim 4, wherein the information includes command information, address information, control information, clock information, or a combination thereof.

6. The apparatus of claim 1, wherein the data buffer comprises:
   a host side I/O circuit configured to receive the first portion of the first signal;
   a conversion circuit coupled to the host side circuit configured to convert the first portion of the first signal to the first portion of the second signal and the second portion of the second signal;
   a memory side I/O circuit coupled to the conversion circuit configured to provide the first portion of the second signal to the first memory and the second portion of the second signal to the second memory; and
   a timing circuit configured to control timing signals of the host side I/O circuit, the conversion circuit, the memory side I/O circuit, or combinations thereof.

7. The apparatus of claim 6, wherein the host side I/O circuit comprises one or more latches and one or more signal driver circuits.

8. The apparatus of claim 6, wherein the timing circuit includes a phase locked loop or a delay locked loop.

9. A system comprising:
   a first data bus having a first width;
   a host coupled to the first data bus and configured to provide a first signal; and
   a memory system comprising:
      a second data bus and a third data bus coupled to the first data bus, wherein each of the second data bus and the third data bus have a second width half the first width, wherein the second data bus is configured to receive a first portion of the first signal and the third data bus is configured to receive a second portion of the first signal;
      a first data buffer configured to receive the first portion of the first signal and convert the first portion of the first signal to a first portion of a second signal and a second portion of a second signal, wherein the second signal is encoded according to a different protocol than the first signal;
      a second data buffer configured to receive the second portion of the first signal and convert the second portion of the first signal to a third portion of the second signal and a fourth portion of the second signal;
      a first memory configured to receive the first portion of the second signal;
      a second memory configured to receive the second portion of the second signal;
      a third memory configured to receive the third portion of the second signal; and
      a fourth memory configured to receive the fourth portion of the second signal.

10. The system of claim 9, wherein the host is further configured to provide a clock signal to the memory system.

11. The system of claim 10, wherein the memory system further comprises a register configured to receive the clock signal, generate a retimed clock signal from the clock signal, and provide the retimed clock signal to the first memory, the second memory, the third memory, the fourth memory, or combinations thereof.

12. The system of claim 11, wherein the host is further configured to provide information to the register, wherein the information comprises command information, control information, address information, or combinations thereof.

13. The system of claim 12, wherein the register is configured to translate the information from the first protocol to the second protocol and provide the information in the second protocol to the first memory, the second memory, the third memory, the fourth memory, or combinations thereof.

14. The system of claim 9, wherein the memory system further comprises fifth through seventh data buses configured to provide the first through fourth portions of the second signal, respectively, wherein the fifth through seventh data buses have a third width half the second width.

15. The system of claim 14, wherein the first width is sixty-four bits, the second width is thirty-two bits, and the third width is sixteen bits.

16. The system of claim 9, wherein the first protocol is a double data rate (DDR) 4 protocol and the second protocol is a low power double data rate (LPDDR) 4x protocol.

17. A method comprising:
   receiving, at a plurality of data buffers via a first data bus having a first width, corresponding portions of a first signal encoded according to a first protocol;
   converting, at the plurality of data buffers, each of the portions of the first signal into a first plurality of portions and a second plurality of portions of a second signal, wherein the second signal is encoded according to a second protocol different from the first protocol; and
   providing individual ones of the first plurality of portions of the second signal to corresponding ones of a first plurality of memories via a second data bus having a second width, wherein the second width is half the first width; and
   providing individual ones of the second plurality of portions of the second signal to corresponding ones of a second plurality of memories via a third data bus having the second width.

18. The method of claim 17, further comprising:
   receiving, at a register, information according to the first protocol;
   translating the information to the second protocol; and
   providing the information according to the second protocol to the first plurality of memories and the second plurality of memories.

19. The method of claim 17, further comprising:
   receiving, at a register, clock information;
   reaming the clock information; and
   providing the clock information retimed to the first plurality of memories and the second plurality of memories.

20. The method of claim 17, wherein the first protocol is a double data rate (DDR) 4 protocol and the second protocol is a low power double data rate (LPDDR) 4x protocol.

* * * * *

UNITED STATES PATENT AND TRADEMARK OFFICE
CERTIFICATE OF CORRECTION

PATENT NO. : 11,088,895 B2  
APPLICATION NO. : 16/881337  
DATED : August 10, 2021  
INVENTOR(S) : Timothy M. Hollis et al.

Page 1 of 1

It is certified that error appears in the above-identified patent and that said Letters Patent is hereby corrected as shown below:

In the Claims

| | Reads | Should Read |
|---|---|---|
| Column 12, Line 66 | "reline the information" | --retime the information-- |
| Column 14, Line 54 | "reaming the clock information" | --retiming the clock information-- |

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*